United States Patent [19]

Foster

[11] Patent Number: 4,833,406
[45] Date of Patent: May 23, 1989

[54] TEMPERATURE COMPENSATED HALL-EFFECT SENSOR APPARATUS

[75] Inventor: Johnny R. Foster, Carrollton, Tex.

[73] Assignee: Household Commercial Financial Services Inc., Prospect Heights, Ill.

[21] Appl. No.: 854,062

[22] Filed: Apr. 17, 1986

Related U.S. Application Data

[63] Continuation of Ser. No. 476,631, Mar. 18, 1983 abandoned.

[51] Int. Cl.⁴ .................. G01N 27/72; G01R 33/02; H01L 43/00; A03K 17/90
[52] U.S. Cl. ................... 324/225; 324/252; 338/32 H; 307/309
[58] Field of Search ............ 324/224, 225, 252; 338/32 H; 307/309; 323/368

[56] References Cited

U.S. PATENT DOCUMENTS

| | | | |
|---|---|---|---|
| 3,671,767 | 6/1972 | Davis | 307/309 |
| 3,816,766 | 6/1974 | Amselmo et al. | 307/309 |
| 4,371,837 | 2/1983 | Sieverin | 324/251 |

Primary Examiner—Reinhard J. Eisenzopf
Assistant Examiner—Walter E. Snow
Attorney, Agent, or Firm—Ross, Howison, Clapp & Korn

[57] ABSTRACT

A temperature compensated Hall-effect sensor apparatus is disclosed which senses the position of a moving body and provides an output signal indicative of the position of the moving body. The apparatus includes a Hall device which senses the application and subsequent removal of a magnetic field and provides an output signal to a constant gain amplifier. Circuitry is provided in the constant gain amplifier for adjusting the gain of the amplifier and also for nulling-out any offset voltage received from the Hall device. The output of the constant gain amplifier is input to a sensitivity compensation and hysteresis circuit for setting a positive-going threshold trip level and a negative-going threshold trip level into a comparator. Circuitry is included which provides both the positive-going and the negative-going threshold trip levels with temperature compensation such that the effective positive and negative trip levels of the comparator remain the same for a given magnetic field and are independent of the temperature of or the signal level out of the Hall device as affected by temperature. Circuitry is provided to change the amount of hysteresis such that the negative-going threshold trip level is a predetermined percentage of the positive-going threshold trip level. The apparatus has a fixed hysteresis ratio.

20 Claims, 3 Drawing Sheets

TEMPERATURE COMPENSATED HALL-EFFECT SENSOR APPARATUS

This application is a continuation, of application Ser. No. 476,631, filed 3-18-83, now abandoned.

BACKGROUND OF THE INVENTION

1. Field of the Invention.

The present invention relates in general to Hall-effect devices, and particularly to apparatus for providing compensation of the output signal of the Hall-effect device to correct for offset error and temperature-related change in the amplitude of the output signal of the Hall-effect device as well as providing means for setting the threshold levels of the apparatus.

2. Description of the Prior Art

It is well known that when a current flows in a Hall-effect device and a magnetic field is applied at right angles to the current flow, an electrical potential is generated which is perpendicular to both the direction of current flow and the magnetic field. The basic Hall-effect sensing element or device is typically a block of semiconductor material containing four electrical contacts. The Hall-effect device or element is made from N-epi material using standard bipolar processing. An area of epi material is isolated using P+ isolation diffusions and N+ emitter diffusions are used to form the four electrical contacts. Two of the contacts are connected to a source for biasing the Hall-effect device and the other two contacts serve as output terminals for the Hall-effect device. The Hall-effect device or sensor may be biased or driven from either a constant current source or a constant voltage source. If a constant voltage source is used, the output from the Hall-effect device will have a constant offset but the sensitivity of the device will change with temperature. If a constant current source is used, the sensitivity of the device will be constant but the output will have an offset voltage that changes with temperature.

It is well known to use a Hall-effect device in a sensing and/or switching application, such as a linear or rotary position sensor. The industry's need for remote sensors that operate in harsh environments has prompted an increased usage of Hall-effect devices or sensors. The problems of Hall-effect device or element offset and sensitivity drift in the output signal has limited their use in critical applications.

Devices for detecting the position or displacement of an object are already known. For example, U.S. Pat. No. 2,987,669 discloses a Hall-effect sensing apparatus in which two Hall-effect devices are positioned in a side-by-side relationship between the poles of a permanent horseshoe magnet. The output terminals of the Hall-effect devices are connected in series opposition. A movable flat plate of soft iron is positioned between the Hall-effect devices and a pole piece of the magnet. The body whose position is to be sensed is attached to the movable flat plate for movement therewith. A pair of stationary flat plates of soft iron are positioned in alignment with the Hall-effect device and between the Hall-effect devices and the movable flat plate. The output of the Hall-effect devices provides a null position indication.

U.S. Pat. No. 4,086,533 discloses a Hall-effect device for determining the angular position of a rotating element and includes first and second parallel arranged magnets forming a symmetric magnetic excitation circuit with a Hall-effect element disposed on the axis thereof. The rotating element has first and second portions made of soft magnetic material which are angularly displaced so as to alternately pass by the first and second magnets, respectively, to produce first and second oppositely directed transverse magnetic field components, H, at the Hall-effect element which thereby generates a signal whose polarity reverses to indicate angular position of the rotating element.

The present invention provides a solution to various prior art deficiencies including the uncompensated change in level or value of the output signal of the Hall-effect device or element with a change in temperature of the device. The change in output signal level of the Hall device, due to temperature change, will cause the Hall-effect sensor apparatus to switch at different magnetic intensities. In addition, many prior-art Hall-effect devices exhibit an offset voltage for which compensation is not provided. This offset voltage represents an output voltage for zero magnetic field input. The amount and direction of offset varies from device to device and is process dependent. Uncompensated offset causes a distribution in the sensitivity of the prior-art sensor apparatus. Also, many prior art Hall-effect sensor apparatus have a fixed value of threshold for tripping purposes without the capability of varying the trip value or setting the trip value at a predetermined value. Many prior-art Hall-effect sensor apparatus do not provide a constant or fixed hysteresis which is not affected by temperature or a hysteresis which may be changed to a different value.

SUMMARY OF THE INVENTION

The present invention provides apparatus for sensing the position of a moving member and providing an output signal indicative of the position or displacement of the moving member. The apparatus includes a Hall device which senses the application and subsequent removal of a magnetic field and provides an output signal to a constant gain amplifier. Means are provided in the constant gain amplifier for adjusting the gain of the amplifier and also for nulling-out any offset voltage received from the Hall device. The output of the constant gain amplifier is input to sensitivity compensation and hysteresis circuitry which includes means for setting the positive-going threshold trip level into a comparator. Means are also provided for setting the negative-going threshold trip level. Means are included which provide both the positive and negative-going threshold trip level with temperature compensation such that the effective positive and negative trip levels of the comparator remain the same for a given magnetic field and are independent of the temperature of or the signal level out of the Hall device as affected by temperature. Means are provided to change the amount of hysteresis such that the negative-going threshold trip level is a predetermined percentage of the positive-going threshold trip level. The apparatus has a fixed hysteresis ratio.

Among the advantages offered by the present invention is a more narrow distribution in the sensitivity of the sensor apparatus. The prevent invention allows the setting of the positive-going threshold trip level and also the setting of the negative-going threshold trip level which also allows the value of hysteresis to be changed. The present invention provides for a fixed hysteresis ratio. The present invention also provides for temperature compensation of both the positive and negative-going threshold trip level. The sensitivity of the apparatus is adjustable.

Examples of the more important features and advantages of this invention have thus been summarized rather broadly in order that the detailed description thereof that follows may be better understood and in order that the contribution to the art may be better appreciated. There are, of course, additional features of the invention that will be described hereinafter and which will also form the subject of the claims appended hereto. Other features of the present invention will become apparent with reference to the following detailed description of a presently preferred embodiment thereof in connection with the accompanying drawing, wherein like reference numerals have been applied to like elements in which:

DESCRIPTION OF THE PREFERRED EMBODIMENT

Figure 1:
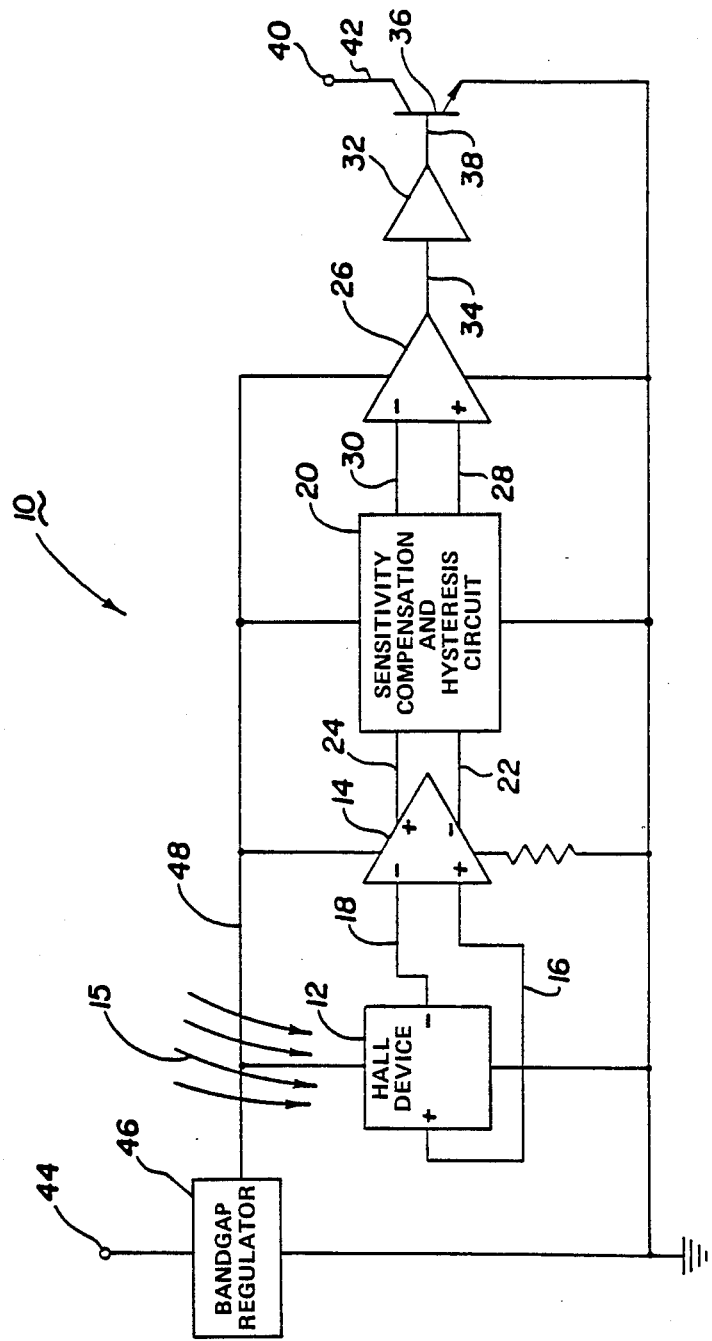
FIG. 1 is a simplified schematic diagram, in block diagram form, illustrating the overall system of the present invention.

Referring now to the drawing and in particular to FIG. 1, Hall-effect sensor apparatus according to the present invention is generally referred to by reference numeral 10. The Hall-effect sensor apparatus 10 is implemented as a thick film hybrid circuit and incorporates a digital Hall-effect sensor integrated circuit with low TCR thick film resistors on a ceramic substrate. The Hall-effect sensor apparatus 10 comprises a Hall device or element 12 whose outputs are connected to the inputs of differential amplifier 14 via leads 16 and 18. Hall device or element 12 comprises four identically matched Hall elements connected in a cross-coupled fashion to reduce the offset and drift in the output signal (leads 16 and 18) due to thermal and stress gradients across the chip. In the disclosed embodiment, differential amplifier 14 is an emitter-coupled differential amplifier. The outputs of differential amplifier 14 are connected to the inputs of sensitivity compensation and hysteresis circuit 20 via leads 22 and 24. The outputs of compensation and hysteresis circuit 20 are connected to the inputs of comparator 26 via leads 28 and 30. The output of comparator 26 is connected to the input of output driver 32 via lead 34. The output of output driver 32 is connected to the base of the open collector output transistor 36 via lead 38. The collector of output transistor 36 is connected to output terminal 40 via lead 42. The output signal of the Hall-effect sensor apparatus 10 is available at terminal 40 for use as desired. $V_{cc}$, applied to terminal 44 as the input voltage to voltage regulator 46, may vary from plus four and one-half volts to plus twenty-four volts with the output voltage of the voltage regulator 46 remaining at a regulated value of 3.3 volts. The output voltage of 3.3 volts from voltage regulator 46 is supplied to the required elements of the Hall-effect sensor apparatus 10 via lead 48.

With respect to the overall operation of the Hall-effect sensor apparatus 10 as shown in FIG. 1, the magnitude of the output signal of the Hall device 12 on leads 16 and 18 varies with the magnitude of the applied magnetic field 15. The output signal comprises the two components of offset voltage and signal voltage. With zero magnetic field applied to the Hall device 12, the output signal will comprise only the offset voltage. Since the Hall device 12 is provided with a constant bias voltage by voltage regulator 46, the value of offset voltage will remain constant even as the temperature of the Hall device 12 changes from room temperature during operation. A typical value of offset voltage, at room temperature, for the disclosed embodiment falls within the range of $-0.7$ to $+0.7$ millivolt with the normal value being nearly zero. As the Hall device 12 is subjected to a perpendicular magnetic field 15, the output signal will include the signal voltage which results from the presence of the magnetic field 15. A typical value of signal voltage resulting from the magnetic field for the disclosed embodiment, at room temperature, is from 1.5 to 2.0 millivolt/100 gauss of magnetic flux density and is normally referred to as the sensitivity of the device. The value or level of signal voltage resulting from the magnetic field will normally decrease with an increase in temperature of the Hall device 12.

The output signal of the Hall device 12 is input to the differential amplifier 14 on leads 16 and 18. Differential amplifier 14 is a fixed or constant gain amplifier over temperature. Means are provided in the circuitry of the differential amplifier 14 to compensate for the value and polarity of the offset voltage input from the Hall device 12 and thereby eliminate the offset voltage from the signal output of the differential amplifier 14. Detailed operation of the differential amplifier 14 will be discussed below with reference to FIG. 3. The output signal from the differential amplifier 14, which will still change in value with temperature because the value of the output signal from the Hall device 12 varies with temperature, is input to the sensitivity compensation and hysteresis circuit 20.

Means are provided in the sensitivity compensation and hysteresis circuit 20 to compensate for any change in the level of signal output from the Hall device 12, as a result of temperature change, such that the effective threshold trip point of comparator 26 is the same for a predetermined value of magnetic field applied to the Hall device 12 even though the level of signal output from the Hall device 12 may change, because of changes in temperature, for a predetermined applied value of magnetic field. Means are also provided in the sensitivity compensation and hysteresis circuit 20 to set the positive-going threshold trip point value or level and also for setting a negative-going threshold trip point which is less in value than the positive-going threshold value. The negative-going threshold trip point is a selectable and fixable percentage of the value of the positive-going threshold and thereby provides hysteresis for the change of states of the comparator as the magnetic field is removed from the Hall device 12. Means are also provided for temperature compensating both the positive-going threshold trip point and the negative-going threshold trip point. The change in signal level out of comparator 26 is transmitted to the input of output driver 32 and reflects or indicates the change of state of comparator 26. Output driver 32 provides additional base drive to output transistor 36 with the output signal appearing at terminal 40.

Figure 2:
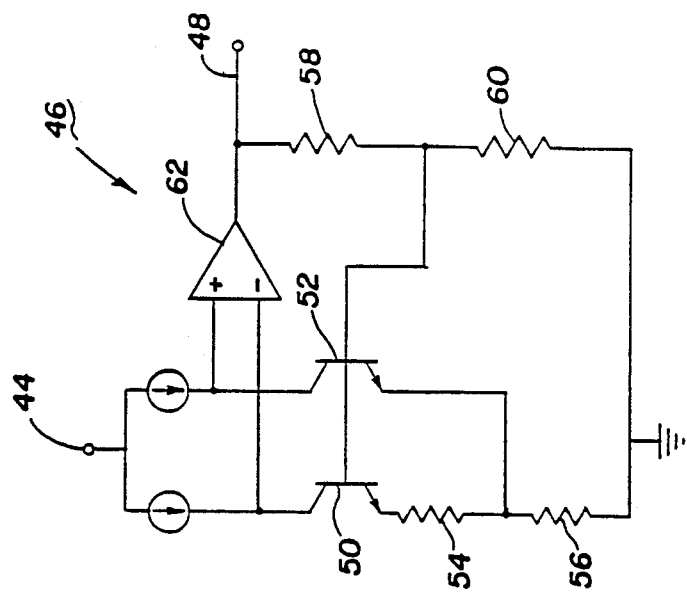
FIG. 2 is a simplified schematic diagram of the voltage regulator circuit of the present invention.

With reference to FIG. 2, the bandgap voltage regulator 46 is disclosed which provides a temperature stable regulated voltage for the Hall-effect sensor apparatus 10. A temperature stable regulated voltage is required in order to minimize or essentially eliminate any drift in the offset voltage from the Hall device 12 due to changes in the bias voltage. The reference voltage of the bandgap regulator 46 is generated by a basic two transistor bandgap cell comprising transistors 50 and 52 together with resistor 54 and 56. The output voltage on lead 48 is set at 3.3 volts by resistors 58 and 60 which are connected in series. Transistor 50 and 52 are connected in the feedback loop of the bandgap regulator 46 where amplifier 62 senses their collector potential and adjusts their common base voltage until the two transistors 50 and 52 operate at equal collector currents. The area of transistor 50 is 10 times the area of transistor 52, which results in a current density ratio of ten to one and a 60 millivolt $V_{be}$ difference generated across resistor 54. Voltage $V_1$ generated across resistor 56 is described by the following equation.

EQUATION #1:

$$V_1 = 2(R56/R54)(V_{be}\text{ Transistor }52 - V_{be}\text{ Transistor }50)$$
$$= 2(R56/R54)(KT/q)\ln(J1/J2).$$

J1/J2 represents the current density ratio of transistor 50 to transistor 52. It can be noted from EQUATION #1 that $V_1$ has a positive temperature coefficient. By proper selection of resistor ratio R56/R54, the temperature coefficient of $V_1$ can be adjusted to cancel the negative temperature coefficient of $V_{be}$ Transistor 52. The sum of $V_{be}$ Transistor 52 and $V_1$ yields the temperature compensated bandgap reference voltage ($V_{ref}$).

EQUATION #2:

$$V_{ref} = V_{be}\text{ Transistor }52 + 2(R56/R54)(KT/q)\ln(J1/J2).$$

The output voltage on lead 48 is set at 3.3 volt by resistor 58 and 60 and is used as the positive supply for the differential amplifier 14 and the sensitivity compensation and hysteresis circuit 20.

Figure 3:
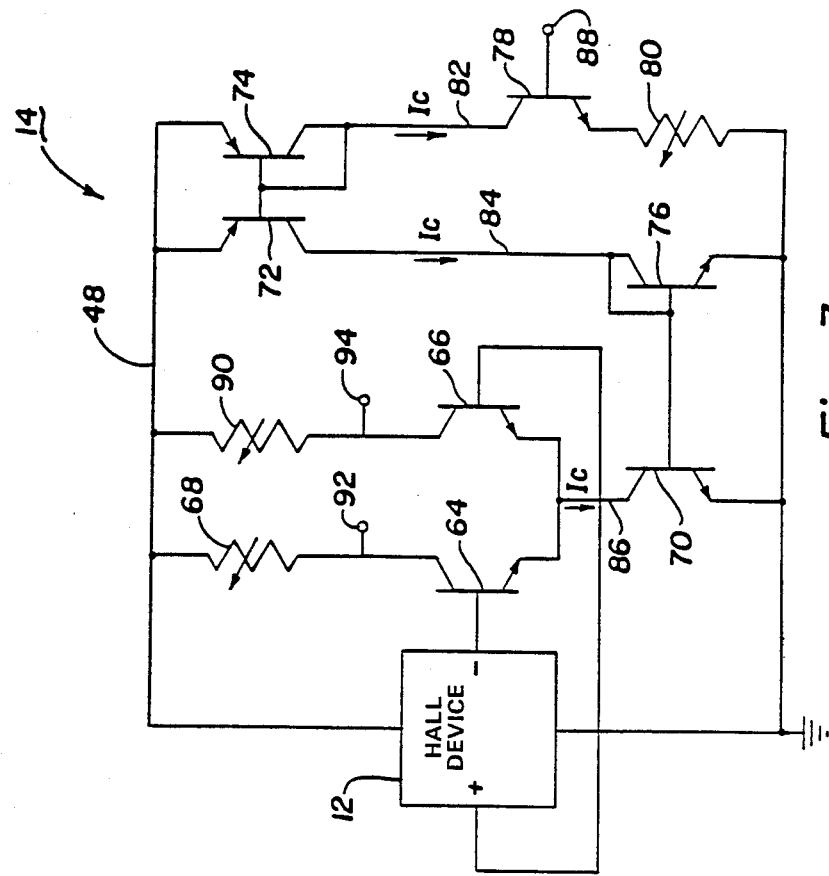
FIG. 3 is a simplified schematic diagram of the constant voltage gain amplifier circuit of the present invention.

As disclosed in FIG. 3, the plus and minus outputs of the Hall device 12 are connected to the inputs of an emitter coupled differential amplifier 14 with the plus output being input to the base of transistor 66 and the minus output being input to the base of transistor 64. The voltage gain of the differential amplifier 14 is given by:

EQUATION #3:

$$A_v = g_m \text{ Resistor }68 = q\, I_c\text{ Resistor }68/2KT$$

It can be noted from EQUATION #3 that the gain $A_v$ has a negative temperature coefficient. In order to obtain a constant gain over temperature, a transconductance compensation scheme is used comprising transistors 70 through 78 and resistor 80. From EQUATION #3, it is noted that by making $I_c$ proportional to absolute temperature T, a constant gain over temperature can be achieved. As is well known, anytime you tie the bases of transistors together and tie their emitters together and you cause one of the transistors to run at a certain current, then the other transistors wil run at the same current because the $V_{be}$'s are the same. Therefore, the same value of Ic flows in leads 82, 84 and 86. Ic in FIG. 3 can be derived from voltage Vx (applied to terminal 88) minus Vbe of transistor 78 and resistor 80 giving:

EQUATION #4:

$$Ic = (Vx - V_{be}\text{ Transistor }78)/\text{Resistor }80.$$

If Vx is replaced by the bandgap reference voltage ($V_{ref}$) of EQUATION #2, then EQUATION #4 becomes:

EQUATION #5:

$$Ic = (V_{be}\text{ Transistor }52 + 2(KT/q)\ln(J1/J2)(R56/R54) - V_{be}\text{ Transistor }78)/\text{Resistor }80.$$

By setting $V_{be}$ Transistor 52 equal to $V_{be}$ Transistor 78 and J1/J2 = 10, EQUATION #4 reduces to:

EQUATION #6:

$$Ic = 4.6\,(KT/q)(\text{Resistor }56/\text{Resistor }54)(/\text{Resistor }80.$$

Substituting EQUATION #6 into EQUATION #3 yields:

EQUATION #7:

$$A_v = 2.3\,(\text{Resistor }56/\text{Resistor }54)(\text{Resistor }68/\text{Resistor }80).$$

Thus, the voltage gain of the differential amplifier 14 is now dependent only on the resistor ratios of Resistor 56/Resistor 54 and Resistor 68/Resistor 80. Resistors 54 and 56 are on-chip and are ion-implanted resistors; therefore, they have equal temperature coefficients and their ratio will remain constant over temperature. Resistors 68 and 80 are external thick film resistors located off chip on the ceramic substrate and they have equal temperature coefficients, therefore, their ratio will remain constant over temperature. Since both of these ratios remain constant over temperature, the gain of differential amplifier 14 remains constant over temperature and if the level of the input signal received from the Hall device 12 decreases then the level of the output signal from the differential amplifier 14 will decrease. Even though the differential amplifier 14 is a constant gain amplifier the amount or value of gain may be varied by laser trimming resistor 80 to adjust for variations in sensitivity of the Hall devices 12. The Hall-effect sensor apparatus 10 is placed in a known magnetic field and the gain of the differential amplifier 14 is adjusted by laser trimming resistor 80 until the desired output is obtained at the differential amplifier 14, thereby eliminating the sensitivity variations of the Hall devices 12 due to process related parameters. To reduce any contribution of differential amplifier 14 to offset and drift, large area cross-coupled quad input pairs are used for transistors 64 and 66.

All Hall devices 12 have some value of offset voltage and even though the value of offset voltage remains constant with constant voltage biasing there is still an offset voltage which causes an offset out of differential amplifier 14. Resistor 90 is also an external thick film resistor located off chip on the ceramic substrate. Resistors 68 and 90 may be laser trimmed to adjust for and cancel out the offset voltage signal received from Hall device 12. The Hall effect sensors apparatus 10 is placed in a location without any magnetic field present and the output of differential amplifier 14 is monitored. If the offset is negative in polarity, then resistor 90 is laser trimmed until the output is zero. Likewise, if the output was positive in polarity, then resistor 68 is laser trimmed until the output is zero. It will be appreciated that there have been resistors provided off the chip, one of which may be laser trimmed to adjust the gain of the constant voltage gain amplifier while the two other resistors may be laser trimmed to null or trim out any zero offset.

At this point, a Hall device 12 provides an output signal, which includes an offset voltage, to a constant gain amplifier in the form of differential amplifier 14. Means are provided in the differential amplifier 14 for adjusting the gain thereof and to trim out or null the offset voltage. The output signal of differential amplifier 14 appears at terminal 92 and 94 with the offset voltage eliminated therefrom but the level of the output signal for a predetermined level of magnetic field (Hall device sensitivity) will vary with temperature because the level of the signal from Hall device 12 will vary with temperature. Eliminating the offset voltage portion of the output signal of the Hall device 12 narrows the distribution in the sensitivity of the manufactured apparatus. Typically, prior art units have specifications for tripping at 300 gauss plus or minus 100 gauss. That rather wide distribution is because of offset voltage which has not been nulled out or eliminated. For an application where the apparatus which has specificiations of 300 gauss plus or minus 100 gauss would not be suitable.

Figure 4:
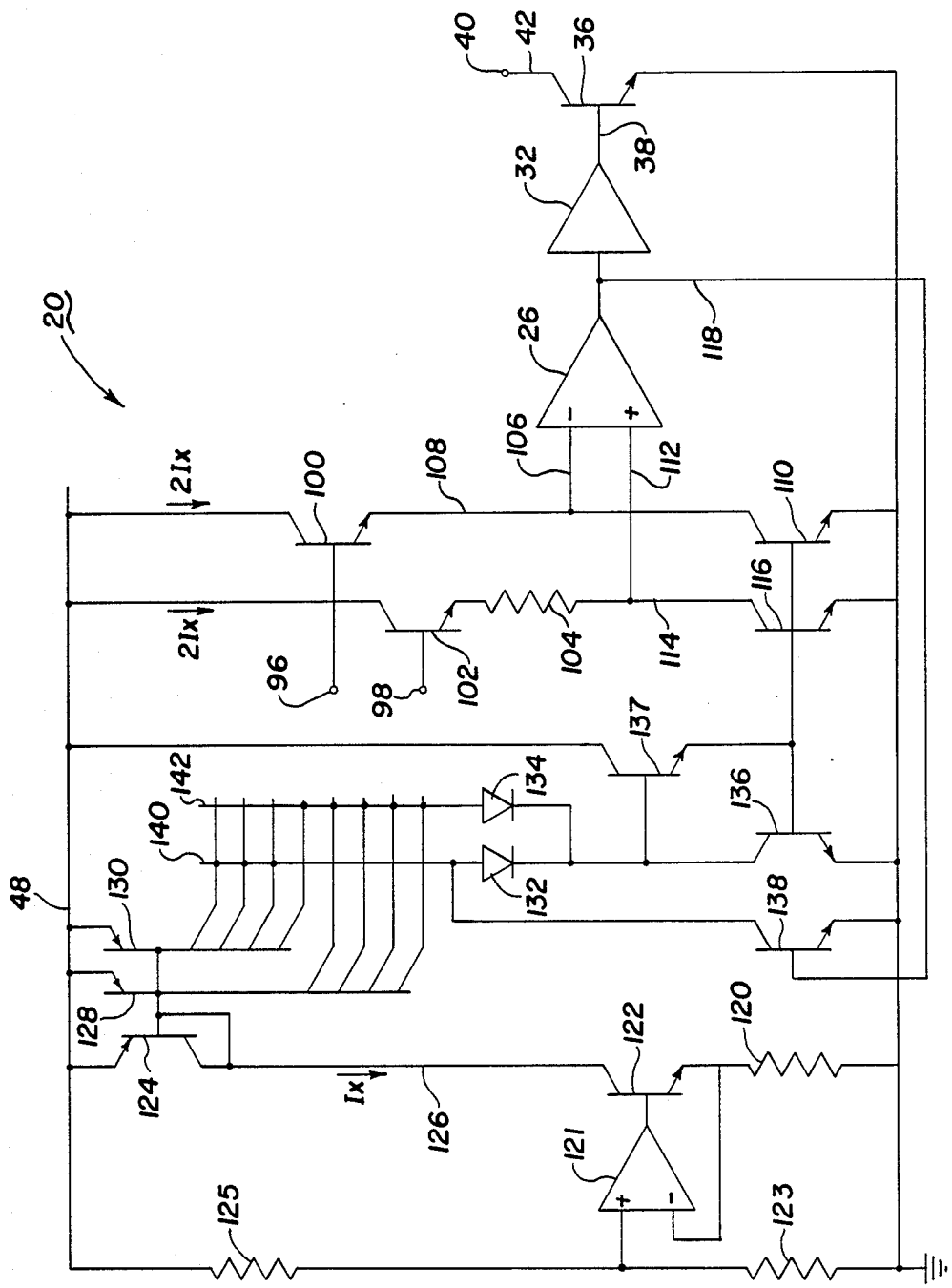
FIG. 4 is a simplified schematic diagram of the threshold detector circuit, with sensitivity compensation and selectable hysteresis, of the present invention.

With reference to FIG. 4, the output of differential amplifier 14 is applied to input terminals 96 and 98 with terminal 94 being tied to terminal 96 and terminal 92 tied to terminal 98. Input terminals 96 and 98 are connected to the bases of transistors 100 and 102, respectively. The actual threshold trip level of the Hall-effect sensor apparatus 10 is set by the value of resistor 104 and the threshold trip voltage is developed across resistor 104. Resistor 104 is a low temperature coefficient thick film resistor with a temperature coefficient of 50 parts/million. The voltage ($V_{R104}$) developed across resistor 104 is equal to the current through resistor 104 times the value of resistor 104. Lead 106 connects the plus input terminal of comparator 26 to lead 108 which connects the emitter of transistor 100 to the collector of transistor 110. Lead 112 connects the negative input terminal of comparator 26 to lead 114 which connects the collector of transistor 116 to resistor 104. With an absence of a magnetic field, the Hall device 12 will have an output signal comprising an offset voltage. This offset voltage is nulled out by the differential amplifier 14 so the input to the sensitivity compensation and hysteresis circuit 20 is zero. As a magnetic field is applied to Hall device 12, the resulting input signal to the sensitivity compensation and hysteresis circuit 20 causes the bases of transistors 100 and 102 to move apart so at some point, the input to the comparator 26 will reach a zero difference and at that point the comparator 26 trip's and its output changes from low to high. Before that trip point is reached, the positive input is lower than the negative input by the amount of voltage across resistor 104 so the positive input has to move up the value of the voltage across resistor 104 before comparator 26 will trip. Comparator 26 will trip when its inputs are equal or very nearly equal. After the comparator 26 trips, the output of the comparator 26 on lead 118, in conjunction with circuitry to be discussed below, causes the current through resistor 104 to be decreased by a predetermined percentage. Since the current through resistor 104 has been decreased, then the value of the threshold trip level is decreased. As the magnetic field is removed from the Hall device 12, the value of the magnetic field has to decrease to a lower value, to cause the comparator 26 to trip back to the prior state, than the value of magnetic field needed to initially trip the comparator 26 when the magnetic field was applied to the Hall device 12. The change in the value of current through resistor 104 provides the change (lowering) in the trip point or level of comparator 26 and provides the hysteresis function.

The circuitry which determines and sets the value of current (2Ix) through resistor 104 comprises the series combination of resistor 120, transistor 122 and transistor 124 through which a current of Ix flows in lead 126. The value of Ix is basically determined by the value of the constant regulated voltage on lead 48 and the value of resistors 120, 123 and 125. Resistor 120 is an epi resistor and comprises the same epi material used in the manufacture of Hall device 12. Once the current Ix is established in lead 126 by the particular value of resistor 120, a PNP current mirror is provided which comprises transistor 124, 128 and 130. Current Ix will flow in transistor 128 and transistor 130 as well as in transistor 124. The current in transistor 128 and 130 combine at the cathodes of diode 132 and diode 134 to become 2Ix and flow through transistor 136. Transistor 138 is not conducting at this time. Transistor 136 is part of an NPN current mirror which comprises transistors 136, 137, 116 and 110; therefore current 2Ix is also flowing through transistor 116 and transistor 110.

As was previously noted, when the magnetic field is applied to Hall device 12, the output signal is amplified by differential amplifier 14 (the offset voltage is nulled out) and applied to terminals 96 and 98 of sensitivity compensation and hysteresis circuit 20 causing the positive input of comparator 26 to exceed the negative input of comparator 26 and causing the comparator 26 to trip. When the comparator trips and the output thereof goes from low to high, the output signal of the comparator 26 not only goes to the input of output driver 32 but also goes over lead 118 to the base of transistor 138 to turn on transistor 138, whose conduction decreases the current through R104, and sets the negative-going threshold trip point to a new and lower value, providing hysteresis. The amount of decrease from 2Ix in the current through resistor 104 is determined by the particular connections made in the cross-bar matrix of the multicollectors of transistors 128 and 130. In the disclosed embodiment, three collectors of transistor 130 are connected to lead 140 (which is connected to the anode of diode 132) and the remaining collector is connected to lead 142 (which is connected to the anode of diode 134). All four collectors of transistor 128 are connected to lead 142. When transistor 138 conducts as a result of the high output from comparator 26, then the current 2Ix is decreased by 3/8 ths since that portion of current 2Ix flows through transistor 138 rather than transistor 136.

The positive-going threshold trip point is determined by the voltage developed across resistor 104 and is defined as:

EQUATION #8:

$+V_{R104} = (R_{104})(2I_x)$

When the amplified output signal from the Hall device 12 exceeds $V_{R104}$, the output of comparator 26 switches high and the current through resistor 104 is reduced by a fixed percentage as determined by the number of collectors connected to the anode of diode 132. This percentage change is mask programmable in discrete increments of 12.5%. The negative-going threshold trip point is now a fixed percentage of the positive-going threshold and is defined by:

EQUATION #9:

$-V_{R104} = (1 - n/8)(2I_x)(R_{104})$ where n=0 to 7.

Equations #8 and 9 are both direct functions of Ix, therefore, both thresholds are temperature compensated. The Hall-effect sensor apparatus 10 has a hysteresis ratio as defined by:

EQUATION #10:

$$\frac{+V_{R104}}{-V_{R104}} = \frac{(R_{104})(2Ix)}{(K)(2Ix)(R_{104})} = \frac{1}{K}$$

where $K = (1 - n/8)$

Both the positive-going threshold trip-point or value and the negative-going threshold trip-point or value are temperature compensated so both trip-points or values will go up and down with temperature such that the Hall-effect sensor apparatus 10 will always trip in the positive-going direction at the same value of magnetic field as it is applied to the Hall device 12 and also will always trip in the negative-going direction at the same value of magnetic field as it is removed from the Hall device 12, irrespective of the temperature of the Hall-effect sensor apparatus 10. For example, for a predetermined value of magnetic field applied to Hall device 12, which is at room temperature, Hall device 12 will have an output voltage y. For that same room temperature, a particular value of Ix is set by epi resistor 120 and 2Ix will flow through resistor 104 when the signal from differential amplifier 14 is applied to terminals 96 and 98. 2Ix flowing through resistor 104 sets a particular positive-going threshold trip point. Suppose now that the temperature of the Hall device 12 increases such that the signal out or the output voltage is decreased to 0.5 y which implies that the equivalent resistance of the Hall device 12 has increased by one hundred percent. Since resistor 120 is also on chip, is made of the same epi material as Hall device 12 and is subject to the same temperature, it is reasonable to assume that the effective resistance of resistor 120 has also increased by one hundred percent.

Therefore, Ix will decrease fifty percent to 0.5 Ix and 2Ix will decrease fifty percent to 0.5(2Ix) causing the positive-going threshold trip-point to also decrease by fifty percent. Therefore, the effective positive-going trip point of comparator 26, when referenced to a predetermined applied value of magnetic field is the same. The effective negative-going trip point, when referenced to a predetermined value of magnetic field will also remain the same since the current through resistor 104, after comparator 26 trips from low to high, is still ⅝ ths of 0.5(2Ix). It will be appreciated that the compensation for change in temperature is accomplished at the input to the comparator 26 by changing the threshold trip points or values into the comparator 26.

In summary, it will be appreciated that means have been provided in the form of a constant gain amplifier (differential amplifier 14) to gain-up or amplify the output voltage of the Hall device 12. The output voltage of the Hall device 12 comprises the offset voltage and the signal voltage. Means are provided in differential amplifier 14 in the form of off-chip thick film resistors 68 and 90 which may be laser trimmed to change their resistive values to adjust for and cancel out the offset voltage signal received from Hall device 12. Resistor 80 in differential amplifier 14 is an off-chip thick film resistor which may be laser trimmed to provide a means for setting or changing the gain of differential amplifier 14 by setting more or less $I_c$ current.

Means are provided for setting the positive-going threshold trip-point or level into comparator 26 in the form of resistor 104 across which the threshold trip-point voltage is generated by a current 2Ix flowing therethrough. Ix is set by the value of resistors 120, 123 and 125 and the constant voltage from voltage regulator 46. Resistor 120 is formed of the same epi material as Hall device 12 and has the same temperature coefficient. Ix is doubled by a PNP current mirror to 2Ix which is set by an NPN current mirror to flow through resistor 104. A cross bar matrix in the PNP current mirror sets the value of the negative-going threshold trip-point or level into comparator 26, after the comparator 26 has tripped on the positive-going threshold trip-point, by determining the amount of decrease in the current set to flow throug resistor 104. The difference between the positive-going and the negative-going threshold trip-points provides the hysteresis. The amount of hysteresis is changeable and is set by connections in the cross-bar matrix of the PNP current mirror. Both the positive-going and the negative-going threshold trip-points are temperature compensated because resistor 120 is formed from the same epi material as Hall device 12 and they have the same temperature coefficients; therefore, their effective resistances will have the same percentage change with the same change in temperature.

There are two sensitivity adjustments available in the Hall-effect sensor apparatus 10. The gain of the differential amplifier 14 may be adjusted by changing resistor 80 to increase or decrease the amount of $I_c$. One can also change the sensitivity of apparatus 10 by changing the value of off-chip resistor 104.

Thus it is apparent that there has been provided, in accordance with this invention, Hall-effect sensor apparatus that substantially incorporates the advantages set forth above. Although the present invention has been described in conjunction with specific forms thereof, it is evident that many alternatives, modifications and variations will be apparent to those skilled in the art in light of the foregoing disclosure. Accordingly, this description is to be construed as illustrative only and is for the purpose of teaching those skilled in the art the manner of carrying out the invention. It is understood that the forms of the invention herewith shown and described are to be taken as the presently preferred embodiments. Various changes may be made in the shape, size and arrangements of parts. For example, equivalent elements may be substituted for those illustrated and described herein, parts may be reversed, and certain features of the invention may be utilized independently of the use of other features of the invention. It will be appreciated that the various modifications, alternatives, etc., may be made without departing from the spirit and scope of the invention as defined in the appended claims.

I claim:

1. A Hall-effect sensor for producing an electrical signal corresponding to magnetic flux density, comprising:
   a Hall-effect element having bias electrodes for supply of bias voltage to the Hall-effect element and output electrodes at which an output voltage is produced, the output voltage having an offset voltage component and a signal voltage component;
   voltage regulator means having a pair of output terminals connected to the bias electrodes and operative for supplying a regulated voltage to the bias electrodes, the regulated voltage being maintained at a substantially constant value independent of load and ambient temperature variations, thereby producing an offset voltage component that is substantially constant and independent of variations in ambient temperature and a sensitivity ratio between the signal voltage component and the magnetic flux density that is decreasing function of temperature, the voltage regulator means including a band gap regulator for supplying the regulated voltage to the bias electrodes; and a measuring circuit including amplifier means having an input coupled to the output electrodes, wherein the amplifier means includes:

a differential amplifier having a gain that decreases as a function of temperature, the differential amplifier including first and second transistors having input electrodes connected to the output electrodes of the Hall-effect element and first and second resistors connected in series with the first and second transistors; and gain compensation means to increase the amplification of the amplifier means, thereby compensating for the gain reduction of the differential amplifier as a function of temperature and providing an amplifier gain that is substantially independent of variations in temperature, the gain compensation means including a third transistor having an input electrode to which the regulated voltage is applied and a third resistor in series with the third transistor, the third transistor being arranged for control of current through both the first and second transistors;

wherein the first and second resistors can be adjusted relative to each other to null out the voltage offset of the Hall-effect element and the third resistor can be adjusted to provide a desired sensitivity ratio between the between the signal voltage component and the magnetic flux density.

2. A Hall-effect sensor for producing an electrical signal corresponding to magnetic flux density, comprising:

a Hall-effect element having bias electrodes for supply of bias voltage to the Hall-effect element and output electrodes at which an output voltage is produced, the output voltage having an offset voltage component and a signal voltage component;

voltage regulator means having a pair of output terminals connected to the bias electrodes and operative for supplying a regulated voltage to the bias electrodes, the regulated voltage being maintained at a substantially constant value independent of load and ambient temperature variations, thereby producing an offset voltage component that is substantially constant and independent of variations in ambient temperature and a sensitivity ratio between the signal voltage component and the magnetic flux density that is a decreasing function of temperature; and a differential amplifier including first and second transistors having input electrodes connected to the output electrodes of the Hall-effect element, a third transistor connected in series with the first and second transistors to control the total current through the first and second transistors, and conductance control means for control of the third transistor to obtain an amplifier gain that is substantially independent of changes in ambient temperature;

wherein the conductance control means includes a resistor that can be adjusted to provide a desired sensitivity ratio between the signal voltage component and the magnetic flux density, a fourth transistor having a base-emitter junction in parallel with the base-emitter junction of the third transistor, a fifth transistor for supplying current to the parallel-connected base-emitter junctions of the third and fourth transistors, a sixth transistor having a base-emitter junction in parallel with the base-emitter junction of the fifth transistor, and a seventh transistor and having a control electrode to which the regulated voltage is applied, each of the first, second, fifth and sixth transistor being of one conductive type and each of the third, fourth and seventh transistors being of a conductive type that is complementary to the one conductive type;

and wherein the resistor is connected in series with the seventh transistor.

3. The Hall-effect sensor as defined in claim 2, and further including a pair of resistors connected in series with the first and second transistors that can be adjusted to compensate for the offset voltage of the Hall-effect element.

4. The Hall-effect sensor as defined in claim 3, wherein the Hall-effect element and the transistors are of the same epitaxial semiconductor material.

5. The Hall-effect sensor as defined in claim 3, wherein the resistors are external thick film resistors, each resistor having a resistance that is substantially independent of variations of temperature.

6. The Hall-effect sensor as defined in claim 3, wherein the resistors are laser-trimmed to provide the offset voltage compensation and sensitivity ratio adjustment.

7. A Hall-effect sensor for producing an electrical signal corresponding to magnetic flux density, comprising:

a Hall-effect element having bias electrodes for supply of bias voltage to the Hall-effect element and output electrodes at which an output voltage is produced, the output voltage having an offset voltage component and a signal voltage component;

voltage regulator means having a pair of output terminals connected to the bias electrodes and operative for supplying a regulated voltage to the bias electrodes, the regulated voltage being maintained at a substantially constant value independent of load and ambient temperature variations, thereby producing an offset voltage component that is substantially constant and independent of variations in ambient temperature and a sensitivity ratio between the signal voltage component and the magnetic flux density that is decreasing function of temperature; and a measuring circuit connected to the output electrodes, the measuring circuit including a comparator having a pair of input terminals, amplifier means for amplifiying signals developed at the output electrodes and applying the amplified signals to the input terminals of the comparator, a resistor connected in series with one of the input terminals of the comparator, shunt transistor means coupled in a shunt relationship with the input terminals of the comparator, the comparator being switched from a first state to a second state at a positive trip level that is a function of the resistance value of the resistor, and control means coupled to the output of the comparator and arranged to control the shunt transistor means to provide hysteresis with the comparator being switched from the second state to the first state at a desired negative trip level.

8. The Hall-effect sensor as defined in claim 7, wherein the control means includes adjustment means to adjust the level of conduction of the shunt transistor means to adjust the ratio of the negative trip level to the positive trip level.

9. The Hall-effect sensor as defined in claim 8, wherein the adjustment means includes a number of connections that are selectively chosen to adjust the ratio in discrete steps.

10. The Hall-effect sensor as defined in claim 8, wherein the adjustment means includes current source means having a number of connections that are selectively chosen for supplying current to the control transistor means in accordance with the number of connections.

11. The Hall-effect sensor as defined in claim 10, wherein the current source means includes multi-collector transistor means.

12. The Hall-effect sensor as defined in claim 10, and further including compensation means for controlling the current source means as a function of temperature, thereby compensating for the decreasing function of temperature of the sensitivity ratio between the signal voltage component and the magnetic flux density.

13. The Hall-effect sensor for producing an electrical signal corresponding to magnetic flux density, comprising:
- a Hall-effect element having bias electrodes for supply of bias voltage to the Hall-effect element and output electrodes at which an output voltage is produced, the output voltage having an offset voltage component and a signal voltage component;
- voltage regulator means having a pair of output terminals connected to the bias electrodes and operative for supplying a regulated voltage to the bias electrodes, the regulated voltage being maintained at a substantially constant value independent of load and ambient temperature variations, thereby producing an offset voltage component that is substantially constant and independent of variations in ambient temperature and a sensitivity ratio between the signal voltage component and the magnetic flux density that is a decreasing function of temperature; and
- amplifier means having offset voltage compensation means for compensating for the offset voltage of the Hall-effect element, the amplifier means including a pair of transistors having input electrodes connected to the output electrodes of the Hall-effect element and a pair of resistors connected in series with the transistors, the resistance values of the resistors being adjustable relative to each other to provide the offset voltage compensation.

14. The Hall-effect sensor as defined in claim 13, wherein at least one of the resistors is laser-trimmed to provide the offset voltage compensation.

15. The Hall-effect sensor as defined in claim 14, wherein the resistors are external thick film resistors, each resistor having a resistor value that is substantially independent of variations in ambient temperature.

16. A Hall-effect sensor for producing an electrical signal corresponding to magnetic flux density, comprising:
- a Hall-effect element having bias electrodes for supply of bias voltage to the Hall-effect element and output electrodes at which an output voltage is produced, the output voltage having an offset voltage component and a signal voltage component;
- voltage regulator means having a pair of output terminals connected to the bias electrodes and operative for supplying a regulated voltage to the bias electrodes, the regulated voltage being maintained at a substantially constant value independent of load and ambient temperature variations, thereby producing an offset voltage component that is substantially constant and independent of variations in ambient temperature and a sensitivity ratio between the signal voltage component and the magnetic flux density that is a decreasing function of temperature; and
- a differential amplifier including first and second transistors having input electrodes connected to the output electrodes of the Hall-effect element, a third transistor connected in series with the first and second transistors to control the total current through the first and second transistors, and conductance control means for control of the third transistor to obtain an amplifier gain that is substantially independent of changes in ambient temperature;
- wherein the conductance control means includes a resistor that can be adjusted to provide a desired sensitivity ratio between the signal voltage component and the magnetic flux density.

17. The Hall-effect sensor as defined in claim 16, wherein the resistor is an external thick film resistor having a resistance value that is substantially independent of variations in ambient temperature.

18. The Hall-effect sensor as defined in claim 17, wherein the resistor can be laser-trimmed to adjust the resistance value.

19. The Hall-effect sensor for producing an electrical signal corresponding to magnetic flux density, comprising:
- a Hall-effect element having bias electrodes for supply of bias voltage to the Hall-effect element and output electrodes at which an output voltage is produced, the output voltage having an offset voltage component and a signal voltage component;
- voltage regulator means having a pair of output terminals conencted to the bias electrodes and operative for supplying a regulated voltage to the bias electrodes, the regulated voltage being maintained at a substantially constant value independent of load and ambient temperature variations, thereby producing an offset voltage component that is substantially constant and independent of variations in ambient temperature and a sensitivity ratio between the signal voltage component and the magnetic flux density that is a decreasing function of temperature; and
- a measuring circuit connected to the output electrodes, the measuring circuit including a detector circuit that operates at controllable threshold levels, a resistor having a resistance value that is a decreasing function of temperature substantially the same as that of the sensitivity ratio, and means for controlling the threshold levels in accordance with the resistance value of the resistor, thereby adjusting the threshold level in proportion to the sensitivity ratio.

20. The Hall-effect sensor as defined in claim 19, wherein the Hall-effect element is of an epitaxial material and the resistor is of the same epitaxial material.

* * * * *